(12) United States Patent
Komaki

(10) Patent No.: US 7,508,696 B2
(45) Date of Patent: Mar. 24, 2009

(54) DECOUPLING CAPACITOR FOR SEMICONDUCTOR INTEGRATED CIRCUIT DEVICE

(75) Inventor: Masaki Komaki, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 390 days.

(21) Appl. No.: 11/508,926

(22) Filed: Aug. 24, 2006

(65) Prior Publication Data

US 2007/0230087 A1 Oct. 4, 2007

(30) Foreign Application Priority Data

Mar. 31, 2006 (JP) ............................. 2006-099248

(51) Int. Cl.
*G11C 11/24* (2006.01)

(52) U.S. Cl. ........................................ 365/149; 365/63
(58) Field of Classification Search ................ 365/149, 365/63

See application file for complete search history.

(56) References Cited

U.S. PATENT DOCUMENTS

| 7,161,792 | B2* | 1/2007 | Sakurabayashi et al. | .... 361/303 |
| 7,321,252 | B2* | 1/2008 | Mizuno et al. | .............. 327/333 |

FOREIGN PATENT DOCUMENTS

JP 2003-86699 A 3/2003

* cited by examiner

*Primary Examiner*—Son Dinh
(74) *Attorney, Agent, or Firm*—Arent Fox LLP

(57) ABSTRACT

A decoupling capacitor includes a first MOS transistor having a first conductivity type. The first MOS transistor functions as a resistor element due to an on-resistance between its source and drain. The source is connected to first power supply wiring. The decoupling capacity further includes a second MOS transistor having a second conductivity type. The second MOS transistor is connected to second power supply wiring. The second MOS transistor functions as a capacitor element and has a gate length greater than that of the first MOS transistor.

18 Claims, 4 Drawing Sheets

Fig.4
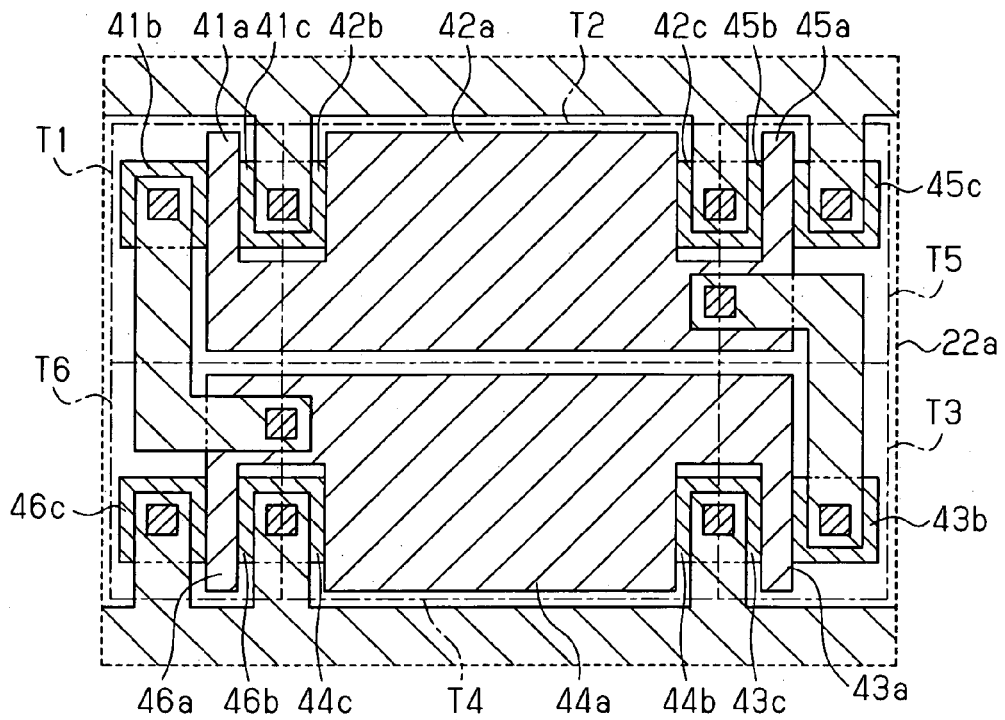
Fig.5A
Fig.5B
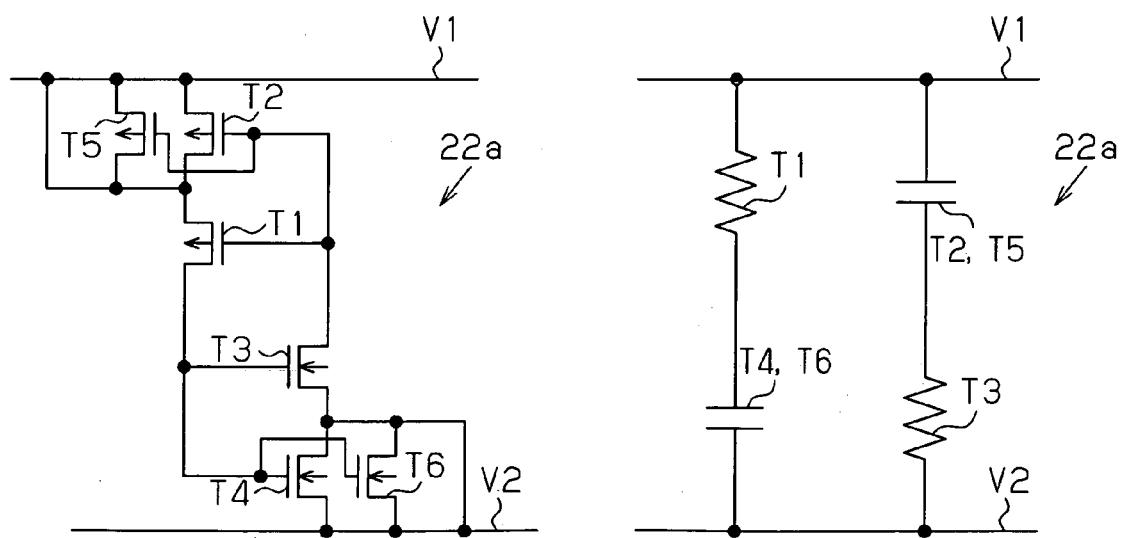

DECOUPLING CAPACITOR FOR SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-099248, filed on Mar. 31, 2006, the entire contents of which are incorporated herein by reference.

BACKGROUND OF THE INVENTION

The present invention relates to a decoupling capacitor and a semiconductor integrated circuit device including a decoupling capacitor.

In recent years, progress has been made to increase the operation speed and enlarge the scale of semiconductor integrated circuit devices (semiconductor devices). This has increased power consumption, which is a factor that leads to the generation of power supply noise. Power supply noise destabilizes the operation of the semiconductor device. The power supply noise may be reduced by arranging a decoupling capacitor (inter-power supply capacitor cell) between a high potential power supply wiring and a low potential power supply wiring of the semiconductor device. It is required to reduce manufacturing variations in semiconductor devices caused by decoupling capacitors.

In the prior art, a semiconductor integrated circuit device, which includes a logic cell, is provided with a decoupling capacitor (inter-power supply capacitor cell) for suppressing fluctuations in power supply voltage and preventing erroneous functioning of the logic cell. The inter-power supply capacitor cell is configured by a P-channel MOS transistor and an N-channel MOS transistor connected between a high potential power supply and a low potential power supply.

The source and the drain of the P-channel MOS transistor are connected to the high potential power supply. The gate of the P-channel MOS transistor is connected to the low potential power supply. Then, a gate oxidized film is formed to form a capacitor element. The source and the drain of the N-channel MOS transistor are connected to the low potential power supply. A diffusion layer and a gate wire on which a gate oxidized film is applied forms a capacitor element. The capacitor element has a capacitance determined by the area in which the diffusion layer and the gate wire overlap each other.

The gate oxidized film has become thinner due to the miniaturization of transistors over recent years. This has resulted in the possibility of the occurrence of electrostatic discharge (ESD) damage in the prior art capacitor element, the gate of which is connected to the power supply wiring. Japanese Laid-Open Patent Publication No. 2003-86699 proposes a decoupling capacitor in which a P-channel MOS transistor and an N-channel MOS transistor each have a gate and a drain connected to each other to prevent ESD. Such P-channel MOS transistor and N-channel MOS transistor form a capacitor element and a resistor connected in series between the high potential power supply and the low potential power supply. Therefore, the decoupling capacity includes a gate capacitor and a resistor, which is for countering ESD.

SUMMARY OF THE INVENTION

The shape of the inter-power supply capacitor cell arranged with the logic cell is subject to restrictions similar to those of the logic cell. For example, when increasing the capacitance of the inter-power supply capacitor cell, the size of the transistor cannot be enlarged in the channel width direction due to the above restrictions. Thus, the transistor must be enlarged in the channel length direction of the transistor. However, this increases the resistance, or the so-called on-resistance, between the source and the drain of the transistor. The large on-resistance interferes with the charge and discharge of the capacitor element when the power supply voltage fluctuates.

One aspect of the present invention is a decoupling capacitor provided with a first MOS transistor having a first conductivity type, including a first source and a first drain, and functioning as a resistor element due to an on-resistance between the first source and the first drain. The first source is connected to first power supply wiring. The decoupling capacitor is also provided with a second MOS transistor having a second conductivity type, including a second source, which is connected to second power supply wiring, and a second drain, and functioning as a capacitor element. The second MOS transistor has a gate length greater than that of the first MOS transistor.

A further aspect of the present invention is a decoupling capacitor provided with a first MOS transistor having a first conductivity type, including a first source and a first drain, and functioning as a resistor element due to an on-resistance between the first source and the first drain, with the first source being connected to first power supply wiring. A second MOS transistor has the first conductivity type, includes a second source, which is connected to the first power supply wiring, and a second drain, and functions as a capacitor element. The second MOS transistor has a gate length greater than that of the first MOS transistor. A third MOS transistor has a second conductivity type, includes a third source and a third drain, and functions as a resistor element due to an on-resistance between the third source and the third drain. The third source is connected to second power supply wiring. A fourth MOS transistor has the second conductivity type, includes a fourth source, which is connected to the second power supply wiring, and a fourth drain, and functions as a capacitor element. The fourth MOS transistor has a gate length greater than that of the third MOS transistor.

Another aspect of the present invention is a semiconductor integrated circuit device including a logic cell and a capacitor cell arranged adjacent to the logic cell. The capacitor cell is provided with a first MOS transistor having a first conductivity type, including a first source and a first drain, and functioning as a resistor element due to an on-resistance between the first source and the first drain. The first source is connected to first power supply wiring. The capacitor cell is also provided with a second MOS transistor having a second conductivity type, including a second source, which is connected to second power supply wiring, and a second drain, and functioning as a capacitor element. The second MOS transistor has a gate length greater than that of the first MOS transistor.

A further aspect of the present invention is a semiconductor integrated circuit device including a logic cell and a capacitor cell arranged adjacent to the logic cell. The capacitor cell is provided with a first MOS transistor having a first conductivity type, including a first source and a first drain, and functioning as a resistor element due to an on-resistance between the first source and the first drain. The first source is connected to first power supply wiring. A second MOS transistor has the first conductivity type, includes a second source, which is connected to the first power supply wiring, and a second drain, and functions as a capacitor element. The second MOS transistor has a gate length greater than that of the first MOS transistor. A third MOS transistor has a second conductivity type, including a third source and a third drain, and functions as a resistor element due to an on-resistance between the third source and the third drain. The third source is connected to second power supply wiring. A fourth MOS transistor has the second conductivity type, includes a fourth source, which is connected to the second power supply wiring, and a fourth drain, and functions as a capacitor element. The fourth MOS transistor has a gate length greater than that of the third MOS transistor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 4 is a layout diagram of a capacitor cell according to a second embodiment of the present invention;

FIGS. 5A and 5B are respectively a circuit diagram and an equivalent circuit diagram of the capacitor cell shown in FIG. 4;

DETAILED DESCRIPTION OF THE PREFERRED EMBODIMENTS

A semiconductor integrated circuit device 10 according to a first embodiment of the present invention will now be discussed.

Figure 1A:
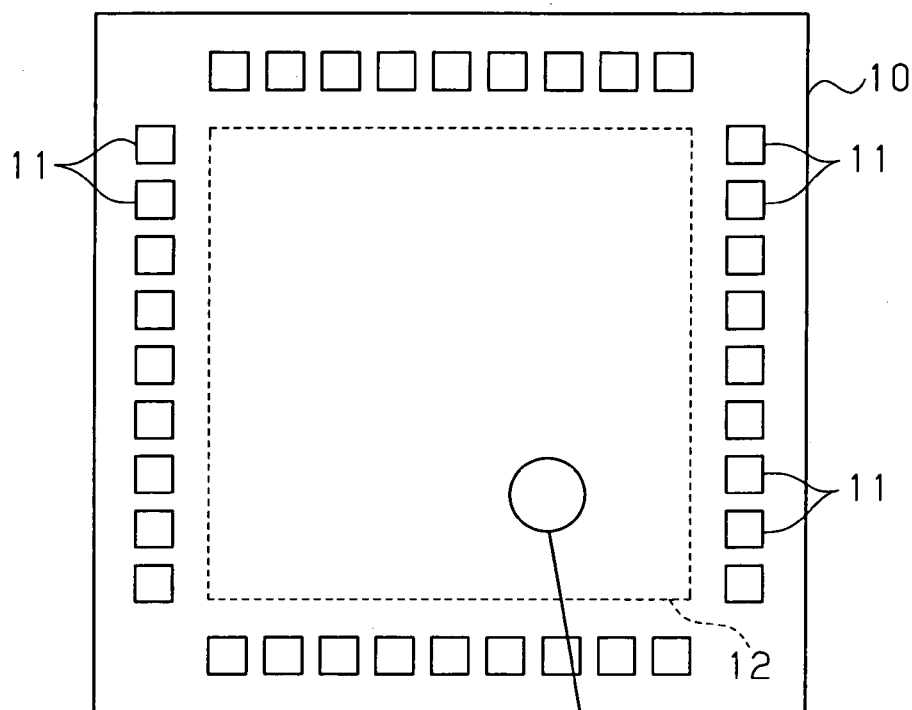
FIG. 1A is a schematic plan view showing a semiconductor device according to a first embodiment of the present invention.
Figure 1B:
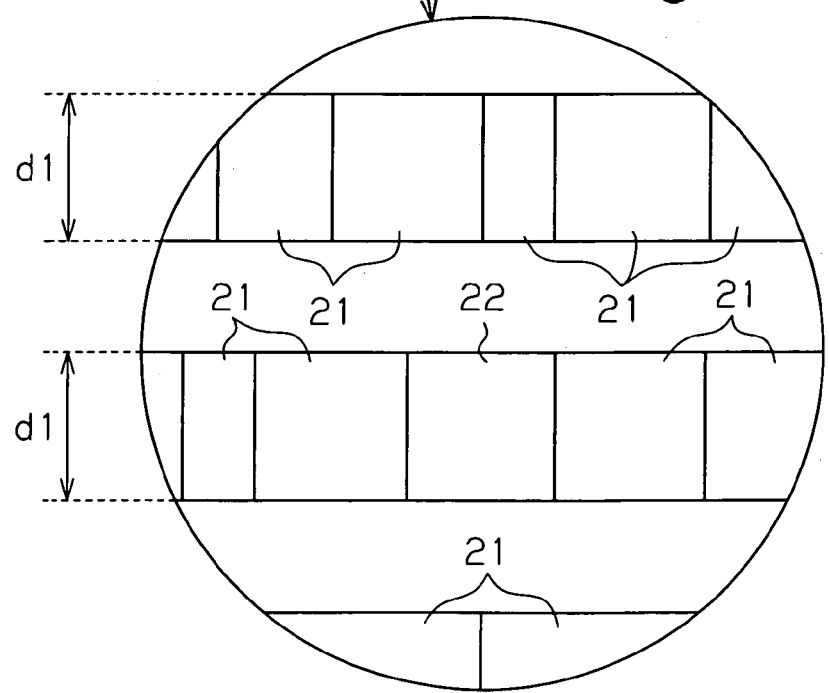
FIG. 1B is a partially enlarged view of the semiconductor device shown in FIG. 1A.

As shown in FIG. 1A, the semiconductor integrated circuit device 10 is formed on a rectangular chip. A plurality of pads 11 are formed along the sides of the chip. An internal circuit 12 is formed at the inner side of the pads 11. As shown in FIG. 1B, the internal circuit 12 includes a plurality of logic cells 21 and a plurality of capacitor cells 22, which function as a decoupling capacitor. The logic cells 21 and the capacitor cells 22 are aligned in a predetermined direction to configure a cell row. The longitudinal direction of each cell row extends in the same direction (longitudinal direction) as power supply wiring (not shown) that supplies power to each cell. The dimension in the lateral direction of each cell row, that is, the width d1 of each logic cell 21 and the capacitor cell 22 is determined in accordance with restrictions implied by process rules for forming the semiconductor integrated circuit device.

The configuration of a capacitor cell 22 will now be described with reference to FIG. 2.

The capacitor cell 22 is formed by a plurality of (four in the first embodiment) transistors T1 to T4. The first transistor T1 and the second transistor T2 are arranged along power supply wiring V1 for a high potential power supply. The third transistor T3 and the fourth transistor T4 are arranged along power supply wiring V2 for a low potential power supply. Each of the first transistor T1 and the second transistor T2 is a P-channel MOS transistor, or a MOS transistor having a first conductivity type. Each of the third transistor T3 and the fourth transistor T4 is an N-channel MOS transistor, or a MOS transistor having a second conductivity type. In the present specification, the transistors T1 to T4 are also referred to as first to fourth MOS transistors. The power supply wirings V1 V2 are metal wires made of copper, aluminum, or the like.

The first transistor T1 and second transistor T2 and the third transistor T3 and fourth transistor T4 are respectively arranged in the longitudinal directions of the power supply wirings V1 and V2. The logic cells 21 are arranged next to the capacitor cells 22 in the same longitudinal directions. That is, the transistors T1 to T4 are arranged in the adjoining direction of the capacitor cells 22 and logic cells 21.

The first transistor T1 includes a gate wire 41a. Diffusion layers 41b and 41c are formed on opposite sides of the gate wire 41a. The second transistor T2 includes a gate wire 42a. Diffusion layers 42b and 42c are formed on opposite sides of the gate wire 42a. The diffusion layer 41c of the first transistor T1 and the diffusion layer 42b of the second transistor T2 are formed continuously. The gate wires 41a and 42a of the two transistors T1 and T2 are made of, for example, polysilicon. The diffusion layers 41b, 41c, 42b, and 42c are p-type diffusion layers formed by implanting predetermined ions into a silicon substrate S1. The gate wire 41a of the first transistor T1 is connected to the gate wire 42a of the second transistor T2.

The gate wire 41a of the first transistor T1 has a gate length (length between the two diffusion layers 41b and 41c) set to be equal to the gate length of a transistor configuring a logic cell 21. The gate wire 42a of the second transistor T2 has a gate length that is greater than that of the gate wire 41a of the first transistor T1 and set in accordance with the capacitance. The resistance (on-resistance) between the source and the drain in each of the first transistor T1 and the second transistor T2 is determined in accordance with the gate length. Therefore, the on-resistance of the second transistor T2 is greater than the on-resistance of the first transistor T1.

The gate length of the gate wire 42a in the second transistor T2 is increased or decreased to change the capacitance of the capacitor cell 22. The gate length of the first transistor T1 is not changed. Thus, the on-resistance of the first transistor T1 is not changed.

The diffusion layer 41c of the first transistor T1 and the diffusion layer 42b of the second transistor T2 are connected to the power supply wiring V1 of the high potential power supply. Further, the diffusion layer 42c of the second transistor T2 is connected to the power supply wiring V1 of the high potential power supply.

The capacitor cell 22 includes a dummy wire D1 formed at the end opposite the first transistor T1 in the adjoining direction. Specifically, the dummy wire D1 is formed at the outer side of the diffusion layer 42c of the second transistor T2 in the adjoining direction. The dummy wire D1 is formed in the same layer as the gate wires 41a and 42a of the first and second transistors T1 and T2 and is made of, for example, polysilicon. The longitudinal direction of the dummy wire D1 is orthogonal to the adjoining direction. Therefore, the dummy wire D1 has a shape similar to the gate wire 41a of the first transistor T1. That is, the gate wire 41a, which is narrow (short gate length), and the dummy wire D1, which is shaped similar to the gate wire 41a, are formed at the boundary between the gate wire 42a, which is wide (long gate length), and the adjacent logic cells in the adjoining direction.

The third transistor T3 includes a gate wire 43a. Diffusion layers 43b and 43c are formed on opposite sides of the gate wire 43a. The fourth transistor T4 includes a gate wire 44a. Diffusion layers 44b and 44c are formed on opposite sides of the gate wire 44a. The diffusion layer 43c of the third transistor T3 and the diffusion layer 44b of the fourth transistor T4 are formed continuously. The gate wires 43a and 44a of the two transistors T3 and T4 are made of, for example, polysilicon. The diffusion layers 43b, 43c, 44b, and 44c are n-type diffusion layers formed by implanting predetermined ions into the silicon substrate S1. The gate wire 43a of the third transistor T3 is connected to the gate wire 44a of the fourth transistor T4.

The gate wire 43a of the third transistor T3 has a gate length (length between the two diffusion layers 43b and 43c) set to be the same as that of a transistor configuring a logic cell 21. The gate wire 44a of the fourth transistor T4 has a gate length that is greater than that of the gate wire 43a of the third transistor T3 and set in accordance with the capacitance. The resistance (on-resistance) between the source and the drain in each of the third transistor T3 and the fourth transistor T4 is determined in accordance with the gate length. Therefore, the on-resistance of the fourth transistor T4 is greater than the on-resistance of the third transistor T3.

The gate length of the gate wire 44a in the fourth transistor T4 is increased or decreased to change the capacitance of the capacitor cell 22. The gate length of the third transistor T3 is not changed. Thus, the on-resistance of the third transistor T3 is not changed.

The diffusion layer 43c of the third transistor T3 and the diffusion layer 44b of the fourth transistor T4 are connected to the power supply wiring V2 of the low potential power supply. Further, the diffusion layer 44c of the fourth transistor T4 is connected to the power supply wiring V2 of the low potential power supply.

The capacitor cell 22 includes a dummy wire D2 formed at the end opposite the third transistor T3 in the adjoining direction. Specifically, the dummy wire D2 is formed at the outer side of the diffusion layer 44c of the fourth transistor T4 in the adjoining direction. The dummy wire D2 is formed in the same layer as the gate wires 43a and 43a of the third and fourth transistors T3 and T4 and is made of, for example, polysilicon. The longitudinal direction of the dummy wire D2 is orthogonal to the adjoining direction. Therefore, the dummy wire D2 has a shape similar to the gate wire 43a of the third transistor T3. That is, the gate wire 43a, which is narrow (short gate length), and the dummy wire D2, which is shaped similar to the gate wire 43a, are formed at the boundary between the gate wire 44a, which is wide (long gate length), and the adjacent logic cells in the adjoining direction.

The diffusion layer 41b of the first transistor T1 is connected to the gate wires 43a and 44a of the third transistor T3 and the fourth transistor T4. The diffusion layer 43b of the third transistor T3 is connected to the gate wires 41a and 42a of the first transistor T1 and the second transistor T2.

Figure 2:
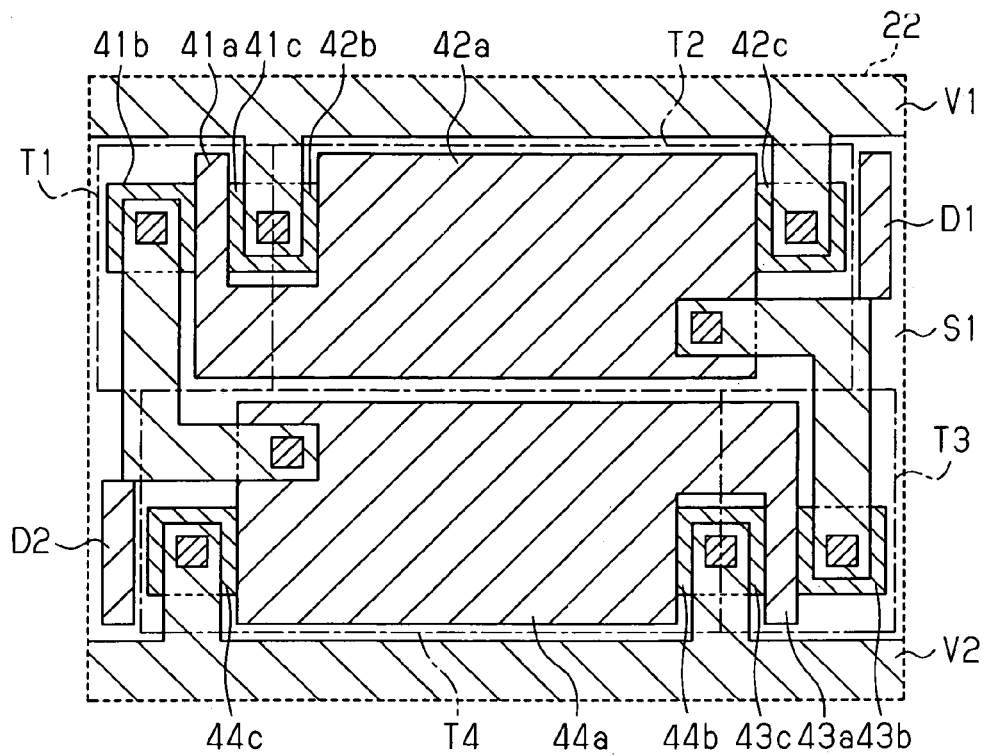
FIG. 2 is a layout diagram of a capacitor cell.

In FIG. 2, a well for forming either the first transistor T1 and the second transistor T2 or the third transistor T3 and the fourth transistor T4 is not shown. For example, when forming the first to fourth transistors T1 to T4 on an n-type substrate, a p-type well is formed in the substrate, and the third and fourth transistors T3 and T4 are formed in the well.

Figure 3A:
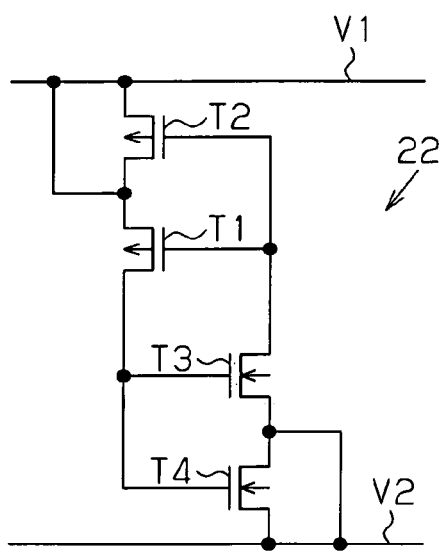
FIGS. 3A and 3B are respectively a circuit diagram and an equivalent circuit diagram of the capacitor cell shown in FIG. 2.

FIG. 3A is a circuit diagram of the capacitor cell 22. The source of the first transistor T1 is connected to the drain of the second transistor T2 and the power supply wiring V1 of the high potential power supply. The source of the second transistor T2 is connected to the power supply wiring V1. The drain of the first transistor T1 is connected to the gates of the third and fourth transistors T3 and T4. The source of the third transistor T3 is connected to the drain of the fourth transistor T4 and the power supply wiring V2 of the low potential power supply. The source of the fourth transistor T4 is connected to the power supply wiring V2. The drain of the third transistor T3 is connected to the gates of the first and second transistors T1 and T2.

Although not shown in the drawings, the back gates of the first transistor T1 and the second transistor T2 are connected to the power supply wiring V1 of the high potential power supply at which the potential is the same as that at their sources. The back gates of the third transistor T3 and the fourth transistor T4 are connected to the power supply wiring V2 of the low potential power supply at which the potential is the same as that at their sources.

Figure 3B:
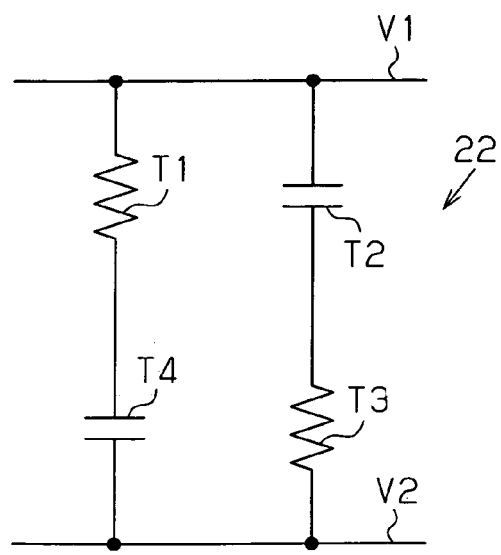

When a semiconductor integrated circuit device including the capacitor cell 22 is activated, transistor leakage current causes the gate potentials at the first and second transistors T1 and T2 to become equal to the low potential power supply level and the gate potentials at the third and fourth transistors T3 and T4 to become equal to the high potential power supply level. This activates each of the transistors T1 to T4. In the activated state, the first transistor T1 functions as a resistor element. Further, the second transistor T2, the source and drain of which are connected to the power supply wiring V1 of the high potential power supply, functions as a capacitor element. The third transistor T3 functions as a resistor element. The fourth transistor T4, the source and drain of which are connected to the power supply wiring V2 of the low potential power supply functions as a capacitor element. Consequently, the power supply wiring V1 of the high potential power supply and the power supply wiring V2 of the low potential power supply are connected by a series circuit including the resistor element formed by the first transistor T1 (first MOS transistor) and the capacitor element formed by the fourth transistor T4 (second MOS transistor), as shown in FIG. 3B. The power supply wirings V1 and V2 are also connected by a series circuit including the capacitor element formed by the second transistor T2 (second MOS transistor) and the resistor element formed by the third transistor T3 (first MOS transistor).

Therefore, the gate of the second transistor T2, which has a capacitance set in accordance with the gate length, is connected to the power supply wiring V2 of the low potential power supply by the third transistor T3, which functions as the resistor element. Similarly, the gate of the fourth transistor T4, which has a capacitance set in accordance with the gate length, is connected to the power supply wiring V1 of the high potential power supply by the first transistor T1, which functions as the resistor element. Therefore, even if an extremely high potential is applied to the power supply wirings V1 and V2 due to static electricity and the like, the high potential is not directly applied to the gates of the transistors T2 and T4. Since high potential is not directly applied to the gate wires 42a and 44a shown in FIG. 2, the ESD resistance of the capacitor cell 22 is improved.

The on-resistance of the first and third transistors T1 and T3 is small since the first transistor T1 and the third transistor T3 only needs to have the gate length required for the ESD resistance. When the power supply voltage fluctuates in each of the second and fourth transistors T2 and T4, which function as the capacitor element, the small resistance of the first and third transistors T1 and T3 does not interfere with the charging and discharging of the capacitor element.

The gate wires 41a and 43a and the dummy wires D1 and D2, which have a relatively small area, are arranged between the gate wires 42a and 44a, which have a relatively large area, and the adjacent logic cells 21, which are arranged on opposite sides of the capacitor cell 22. The gate wires 41a and 43a and the dummy wires D1 and D2 suppress changes in the properties of the logic cells 21 adjacent to the capacitor cell 22. That is, in recent photolithography technology for miniaturized semiconductors, the width of an exposure pattern changes due to interference of light caused by pattern density. This results in variations in the pattern width. Such manufacturing variations result in changes in the transistor properties of logic cells located in the periphery of the gate wires 42a and 44a, which have a relatively large area. With regards to such a problem, the layout of the gate wires 41a and 43a and the dummy wires D1 and D2 suppress changes in the transistor properties of the logic cells 21, which are adjacent to the capacitor cell 22.

The first embodiment has the advantages described below.

(1) A series circuit including the second transistor T2, which functions as the capacitor element, and the third transistor T3, which functions as the resistor element, and a series circuit including the first transistor T1, which functions as the resistor element, and the fourth transistor T4, which functions as the capacitor element, are connected between the power supply wiring V1 of the high potential power supply and the power supply wiring V2 of the low potential power supply. In this configuration, the gates of the second transistor T2 and the fourth transistor T4 are not directly connected to the power supply wirings V1 and V2, respectively. Thus, even if an extremely high potential is applied to the power supply wirings V1 and V2 due to static electricity and the like, the high potential is not directly applied to the gates of the second transistor T2 and the fourth transistor T4, which function as the capacitor elements. Thus, the ESD resistance is improved. Further, since the on-resistance of the first transistor T1 and the third transistor T3 is small, the charging and discharging of the capacitor element during power supply voltage fluctuation is not inhibited.

(2) Dummy wires D1 and D2, which are narrower than the gate wires 42a and 44a, are formed between the logic cell 21 and the adjacent gate wires 42a and 44a of the transistors T2 and T4, which function as the capacitor elements. The dummy wires D1 and D2 suppress changes in the transistor properties of the adjacent logic cell 21 with the gate wires 42a and 44a of the transistors T2 and T4 that function as the capacitor elements.

The first transistor T1 is arranged between the adjacent logic cell 21 and the second transistor T2. The gate wire 41a of the first transistor T1 is narrower than the gate wire 42a of the second wiring T2. Thus, the gate wire 41a of the first transistor T1 suppresses changes in the transistor properties of the adjacent logic cell 21 with the gate wire 42a of the transistor T2 that functions as the capacitor element.

The third transistor T3 is arranged between the adjacent logic cell 21 and the fourth transistor T4. The gate wire 43a of the third transistor T3 is narrower than the gate wire 44a of the fourth transistor T4. Thus, the gate wire 43a of the third transistor T3 suppresses changes in the transistor properties of the adjacent logic cell 21 with the gate wire 44a of the transistor T4 that functions as the capacitor element.

A second embodiment of the present invention will now be discussed. To avoid redundancy, like or same reference numerals are given to those components that are the same as the corresponding components of the first embodiment. Such components will not be described in detail.

As shown in FIG. 4, a capacitor cell 22a includes a plurality of (six in the second embodiment) transistors T1 to T6. The first transistor T1, the second transistor T2, and the fifth transistor T5 are aligned along the power supply wiring V1 of the high potential power supply. The third transistor T3, the fourth transistor T4, and the sixth transistor T6 are aligned along the power supply wiring V2 of the low potential power supply. The first transistor T1, the second transistor T2, and the fifth transistor T5 are P-channel MOS transistors. The third transistor T3, the fourth transistor T4, and the sixth transistor T6 are N-channel transistors.

The fifth transistor T5 has a shape similar to that of the first transistor T1. The fifth transistor T5 includes a gate wire 45a and diffusion layers 45b and 45c. The gate wire 45a is formed in the same manner as the gate wire 41a of the first transistor T1. The gate wire 45a of the fifth transistor T5 is connected to the gate wires 41a and 42a of the first and second transistors T1 and T2.

In FIG. 4, the gate wire 41a of the first transistor T1 is arranged between the gate wire 42a of the second transistor T2 and the logic cell (not shown) adjacent to the left. The gate wire 45a of the fifth transistor T5 is arranged between the gate wire 42a of the second transistor T2 and the logic cell (not shown) adjacent to the right. That is, the gate wire 45a of the fifth transistor T5 is arranged in place of the dummy wire D1 of the first embodiment. Therefore, the gate wire 45a of the fifth transistor T5 functions to suppress changes in the transistor properties of the adjacent logic cell in the same manner as the dummy wire D1 of the first embodiment.

The sixth transistor T6 has a shape similar to the shape of the third transistor T3. The sixth transistor T6 includes a gate wire 46a and diffusion layers 46b and 46c. The gate wire 46a is formed in the same manner as the gate wire 43a of the third transistor T3. The gate wire 46a of the sixth transistor T6 is connected to the gate wires 43a and 44a of the third and fourth transistors T3 and T4.

In FIG. 4, the gate wire 43a of the third transistor T3 is arranged between the gate wire 44a of the fourth transistor T4 and the logic cell (not shown) adjacent to the right. The gate wire 46a of the sixth transistor T6 is arranged between the gate wire 44a of the fourth transistor T4 and the logic cell (not shown) adjacent to the left. That is, the gate wire 46a of the sixth transistor T6 is arranged in place of the dummy wire D2 of the first embodiment. Therefore, the gate wire 46a of the sixth transistor T6 functions to suppress changes in the transistor properties of the adjacent logic cell in the same manner as the dummy wire D2 of the first embodiment.

The capacitor cell 22a including the transistors T1 to T6 configure the circuit shown in FIG. 5A. That is, the fifth transistor T5 is connected in parallel to the second transistor T2. The sixth transistor T6 is connected in parallel to the fourth transistor T4. The gate potential of each transistor T1 to T6 is determined when activated. In this state, the first transistor T1 functions as the resistor element, the second and fifth transistors T2 and T5 function as the capacitor elements, the third transistor T3 function as the resistor elements, and the fourth and sixth transistors T4 and T6 function as the capacitor elements. Consequently, a series circuit including the resistor element of the first transistor T1 and the capacitor element of the fourth and sixth transistors T4 and T6, and a series circuit including the capacitor elements of the second and fifth transistors T2 and T5, and the resistor element of the third transistor T3 are connected between the power supply wiring V1 of the high potential power supply and the power supply wiring V2 of the low potential power supply, as shown in FIG. 5B.

Although not shown in the drawings, the back gates of the first transistor T1, the second transistor T2, and the fifth transistor T5, which are P-channel MOS transistors, are connected to the power supply wiring V1 of the high potential power supply having the same potential as the source potential. The back gates of the third transistor T3, the fourth transistor T4, and the sixth transistor T6, which are N-channel MOS transistors, are connected to the power supply wiring V2 of the low potential power supply having the same potential as the source potential.

The second embodiment has the advantages described below.

In the capacitor cell 22a, the fifth transistor T5 is connected in parallel to the first transistor T1 or the second transistor T2 and has a gate length that is shorter than that of the second transistor T2. The sixth transistor T6 is connected in parallel to the third transistor T3 or the fourth transistor T4 and has a gate length that is shorter than the fourth transistor T4. The fifth transistor T5 and the first transistor T1 are arranged at opposite sides of the second transistor T2, and the sixth transistor T6 and the third transistor T3 is arranged at opposite sides of the fourth transistor T4. The gate wires 41a and 45a of the first transistor T1 and the fifth transistor T5 are narrower than the gate wire 42a of the second transistor T2. Thus, the gate wires 41a and 45a of the first transistor T1 and the fifth transistor T5 suppress changes in the transistor properties of the adjacent logic cell that would be caused by the gate wire 42a of the transistor T2 functioning as the capacitor element. Furthermore, the gate wires 43a and 46a of the third transistor T3 and the sixth transistor T6 are narrower than the gate wire 44a of the fourth transistor T4. Thus, the narrow gate wires 43a and 46a suppress changes in the transistor properties of the adjacent logic cell 21 that would be caused by the gate wire 44a of the transistor T4 functioning as the capacitor element.

It should be apparent to those skilled in the art that the present invention may be embodied in many other specific forms without departing from the spirit or scope of the invention. Particularly, it should be understood that the present invention may be embodied in the following forms.

Figure 6:
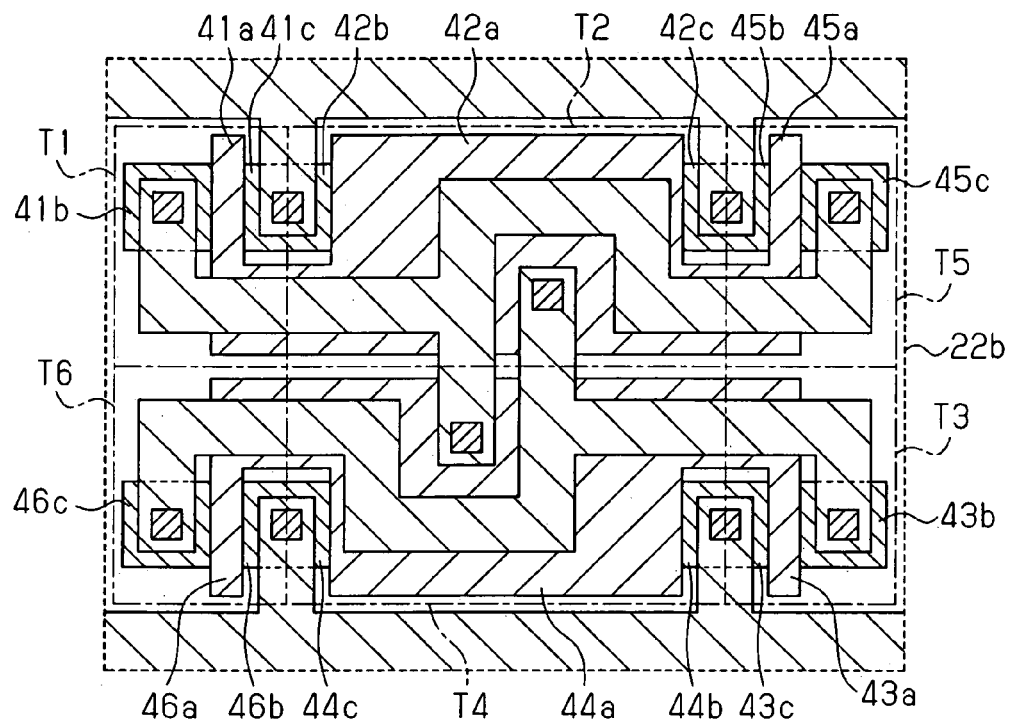
FIG. 6 is a layout diagram of a capacitor cell in a modification of the present invention.
Figure 7A:
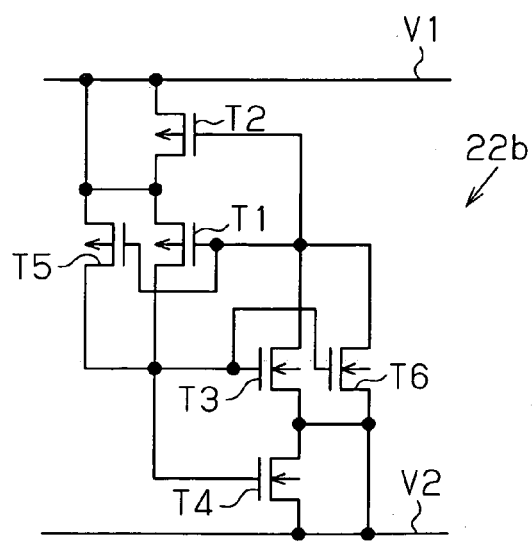
FIGS. 7A and 7B are respectively a circuit diagram and an equivalent circuit diagram of the capacitor cell shown in FIG. 6.
Figure 7B:
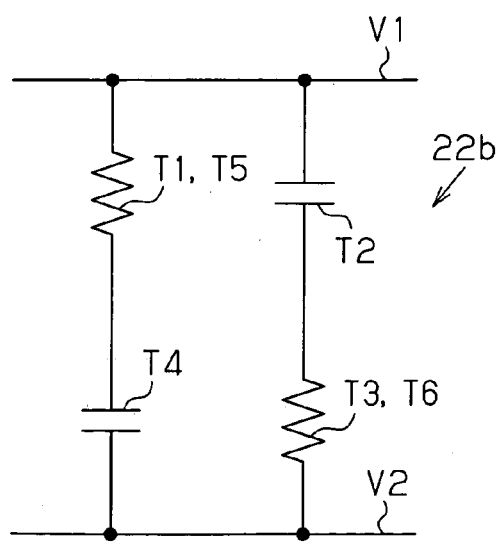

In the second embodiment, the connection of the fifth and sixth transistors T5 and T6 may be changed. FIG. 6 shows a capacitor cell 22b in which the diffusion layer 45b of the fifth transistor T5 is formed continuously with the diffusion layer 42c of the second transistor T2. The diffusion layer 45c of the fifth transistor T5 is connected to the diffusion layer 41b of the first transistor T1 and connected to the gate wire 44a of the fourth transistor T4. The diffusion layer 46b of the sixth transistor T6 is formed continuously with the diffusion layer 44c of the fourth transistor T4. The other diffusion layer 46c of the sixth transistor T6 is connected to the diffusion layer 43b of the third transistor T3 and the gate wire 42a of the second transistor T2. In the capacitor cell 22b, the first transistor T1 and the fifth transistor T5 are connected in parallel, as shown in FIG. 7A. Furthermore, the third transistor T3 and the sixth transistor T6 are connected in parallel. The gate potential of each transistor T1 to T6 is determined when activated. In this state, the first and sixth transistors T1 and T6 function as the resistor elements, the second transistor T2 function as the capacitor element, the third and sixth transistors T3 and T6 function as the resistor elements, and the fourth transistor T4 function as the capacitor element. Consequently, a series circuit, which includes the resistor elements of the first and fifth transistors T1 and T5 and the capacitor element of the fourth transistor T4, and a series circuit, which includes the capacitor element of the second transistor T2 and the resistor element of the third and sixth transistors T3 and T6 are connected between the power supply wiring V1 of the high potential power supply and the power supply wiring V2 of the low potential power supply.

In each embodiment, a dummy wire may be arranged between the first transistor T1 and the adjacent logic cell 21. A dummy wire may be arranged between the third transistor T3 and the adjacent logic cell 21. In the embodiments of FIGS. 4 and 6, dummy wires may be arranged between the fifth transistor T5 and the adjacent logic cell 21 and between the sixth transistor T6 and the adjacent logic cell 21.

The fifth transistor T5 or the sixth transistor T6 may be a dummy wire in the embodiments of FIGS. 4 and 6.

In each embodiment, the connecting destination of a transistor back gate may be changed when necessary. For example, a back gate connection may be made so as to apply a bias voltage of a potential differing from the source potential. In this case, the on-resistance is controlled by changing the threshold voltage of the transistor with the bias voltage of the back gate.

In the first embodiment, adjacent cell rows are spaced from each other, as shown in FIG. 1. However, adjacent cell rows may be in contact with each other.

The present examples and embodiments are to be considered as illustrative and not restrictive, and the invention is not to be limited to the details given herein, but may be modified within the scope and equivalence of the appended claims.

What is claimed is:

1. A decoupling capacitor comprising:
    a first MOS transistor having a first conductivity type, including a first source and a first drain, and functioning as a resistor element due to an on-resistance between the first source and the first drain, with the first source being connected to first power supply wiring; and
    a second MOS transistor having a second conductivity type, including a second source, which is connected to second power supply wiring, and a second drain, and functioning as a capacitor element, wherein the second MOS transistor has a gate length greater than that of the first MOS transistor.

2. The decoupling capacitor according to claim 1, wherein the first MOS transistor includes a first gate, the second MOS transistor includes a second gate, and the first gate is narrower than the second gate as measured along a longitudinal direction of the first power supply wiring.

3. The decoupling capacitor according to claim 1, wherein the resistor element and the capacitor element form a series circuit connecting the first and second power supply wirings.

4. A decoupling capacitor comprising:
    a first MOS transistor having a first conductivity type, including a first source and a first drain, and functioning as a resistor element due to an on-resistance between the first source and the first drain, with the first source being connected to first power supply wiring; and
    a second MOS transistor having the first conductivity type, including a second source, which is connected to the first power supply wiring, and a second drain, and functioning as a capacitor element, wherein the second MOS transistor has a gate length greater than that of the first MOS transistor;
    a third MOS transistor having a second conductivity type, including a third source and a third drain, and functioning as a resistor element due to an on-resistance between the third source and the third drain, with the third source being connected to second power supply wiring; and
    a fourth MOS transistor having the second conductivity type, including a fourth source, which is connected to the second power supply wiring, and a fourth drain, and functioning as a capacitor element, wherein the fourth MOS transistor has a gate length greater than that of the third MOS transistor.

5. The decoupling capacitor according to claim 4, wherein the decoupling capacitor is used with adjacent logic cells, and the second and fourth transistors respectively include second and fourth gate wires, each having a width, the decoupling capacitor further comprising:
dummy wires, each having a width that is less than the widths of the second and fourth gate wires, the dummy wires being formed between the second gate wire and an adjacent one of the logic cells and between the fourth gate wire and an adjacent one of the logic cells.

6. The decoupling capacitor according to claim 4, wherein the decoupling capacitor is used with an adjacent logic cell, and the first MOS transistor is arranged between the logic cell and the second MOS transistor.

7. The decoupling capacitor according to claim 4, wherein the decoupling capacitor is used with an adjacent logic cell, and the third MOS transistor is arranged between the logic cell and the fourth MOS transistor.

8. The decoupling capacitor according to claim 4, further comprising:
a fifth MOS transistor connected in parallel to the first MOS transistor or the second MOS transistor and having a gate length less than that of the second MOS transistor, with the fifth MOS transistor and the first MOS transistor being arranged at opposite sides of the second MOS transistor.

9. The decoupling capacitor according to claim 4, further comprising:
a fifth MOS transistor connected in parallel to the first MOS transistor or the second MOS transistor and having a gate length less than that of the second MOS transistor; and
a sixth MOS transistor connected in parallel to the third MOS transistor or the fourth MOS transistor and having a gate length less than that of the fourth MOS transistor;
wherein the fifth MOS transistor and the first MOS transistor are arranged at opposite sides of the second MOS transistor, and the sixth MOS transistor and the third MOS transistor are arranged at opposite sides of the fourth MOS transistor.

10. The decoupling capacitor according to claim 4, wherein the gate length of the fourth MOS transistor is greater than the gate length of the first MOS transistor.

11. The decoupling capacitor according to claim 5, wherein each dummy wire is formed in the vicinity of an edge of the decoupling capacitor.

12. A semiconductor integrated circuit device comprising:
a logic cell; and
a capacitor cell arranged adjacent to the logic cell, the capacitor cell including:
a first MOS transistor having a first conductivity type, including a first source and a first drain, and functioning as a resistor element due to an on-resistance between the first source and the first drain, with the first source being connected to first power supply wiring; and
a second MOS transistor having a second conductivity type, including a second source, which is connected to second power supply wiring, and a second drain, and functioning as a capacitor element, wherein the second MOS transistor has a gate length greater than that of the first MOS transistor.

13. A semiconductor integrated circuit device comprising:
a logic cell; and
a capacitor cell arranged adjacent to the logic cell, the capacitor cell including:

a first MOS transistor having a first conductivity type, including a first source and a first drain, and functioning as a resistor element due to an on-resistance between the first source and the first drain, with the first source being connected to first power supply wiring; and
a second MOS transistor having the first conductivity type, including a second source, which is connected to the first power supply wiring, and a second drain, and functioning as a capacitor element, wherein the second MOS transistor has a gate length greater than that of the first MOS transistor;
a third MOS transistor having a second conductivity type, including a third source and a third drain, and functioning as a resistor element due to an on-resistance between the third source and the third drain, with the third source being connected to second power supply wiring; and
a fourth MOS transistor having the second conductivity type, including a fourth source, which is connected to the second power supply wiring, and a fourth drain, and functioning as a capacitor element, wherein the fourth MOS transistor has a gate length greater than that of the third MOS transistor.

14. The semiconductor integrated circuit device according to claim 13, wherein:
the logic cell is one of a plurality of logic cells including two logic cells arranged on opposite sides of the capacitor cell; and
the second and fourth transistors respectively include second and fourth gate wires, each having a width, the capacitor cell further including:
dummy wires, each having a width that is less than the widths of the second and fourth gate wires, the dummy wires being formed between one of the two logic cells and the second gate wire and between the other one of the two logic cells and the fourth gate wire.

15. The semiconductor integrated circuit device according to claim 13, wherein the first MOS transistor is arranged between the logic cell and the second MOS transistor.

16. The semiconductor integrated circuit device according to claim 13, wherein the third MOS transistor is arranged between the logic cell and the fourth MOS transistor.

17. The semiconductor integrated circuit device according to claim 13, wherein the capacitor cell further includes:
a fifth MOS transistor connected in parallel to the first MOS transistor or the second MOS transistor and having a gate length less than that of the second MOS transistor, with the fifth MOS transistor and the first MOS transistor being arranged at opposite sides of the second MOS transistor.

18. The semiconductor integrated circuit device semiconductor integrated circuit device according to claim 13, wherein the capacitor cell further includes:
a fifth MOS transistor connected in parallel to the first MOS transistor or the second MOS transistor and having a gate length less than that of the second MOS transistor; and
a sixth MOS transistor connected in parallel to the third MOS transistor or the fourth MOS transistor and having a gate length less than that of the fourth MOS transistor;
wherein the fifth MOS transistor and the first MOS transistor are arranged at opposite sides of the second MOS transistor, and the sixth MOS transistor and the third MOS transistor are arranged at opposite sides of the fourth MOS transistor.

* * * * *